United States Patent [19]

Figueroa et al.

[11] Patent Number: 4,634,928
[45] Date of Patent: Jan. 6, 1987

[54] SUPERLUMINESCENT LIGHT-EMITTING DIODE AND RELATED METHOD

[75] Inventors: Luis Figueroa, Torrance; Joseph W. Niesen, Fullerton; Lawrence M. Zinkiewicz, Rancho Palos Verdes; Charles B. Morrison, San Pedro, all of Calif.

[73] Assignee: TRW Inc., Redondo Beach, Calif.

[21] Appl. No.: 724,870

[22] Filed: Apr. 19, 1985

[51] Int. Cl.[4] .................................. H01S 3/19
[52] U.S. Cl. ............................. 313/499; 29/569 L; 357/17; 362/800; 372/44
[58] Field of Search ............... 313/499, 501; 362/800; 357/17; 372/44, 45; 29/569 L

[56] References Cited

U.S. PATENT DOCUMENTS 4,438,446 3/1984 Tsang ............................ 357/17
4,573,163 2/1986 Kaminow ...................... 357/17 X Primary Examiner—Stewart J. Levy
Assistant Examiner—Joseph W. Roskos
Attorney, Agent, or Firm—Noel F. Heal; Robert J. Stern

[57] ABSTRACT

A superluminescent light-emitting diode in which the spectral width of the output increases with increasing optical output power, thereby allowing the generation of high optical output powers with a broad frequency spectrum that is desirable for some applications of the superluminescent diodes. This desirable characteristic is obtained by structuring the diode to produce a non-uniform gain profile across its active layer. Alternative approaches for achieving the non-uniform gain profile include varying the thickness of the active layer, and varying the current density by employing an asymmetrical channel configuration or an asymmetrical electrical contact strip.

16 Claims, 6 Drawing Figures

SUPERLUMINESCENT LIGHT-EMITTING DIODE AND RELATED METHOD

CROSS-REFERENCE TO RELATED APPLICATIONS

This application is related to the subject matter disclosed in an application entitled "Semiconductor Laser with Blocking Layer," filed by Charles B. Morrison et al. on July 20, 1984, and given Ser. No. 632,767, and an application entitled "Twin Channel Laser" by Luis Figueroa et al., filed Dec. 1, 1983, and given Ser. No. 556,879, both applications being assigned to the same assignee as the present application.

BACKGROUND OF THE INVENTION

This invention relates generally to light-emitting devices, and more particularly, to superluminescent light-emitting diodes. Light-emitting diodes are well known semiconductor devices in which an electrical current is passed through a diode junction and produces light emission in an active layer of semiconductor material at the junction. At least one facet of the device is coated with an anti-reflective material, through which light is emitted. This is to be contrasted with a laser diode, in which stimulated emission of light occurs, and there are usually two opposed reflective facets, and there are repeated reflections of light between the facets before a coherent laser beam emerges. The resulting laser beam usually has a very narrow spectral width, i.e. it is practically monochromatic.

Light-emitting diodes operating at relatively high powers and having a relatively broad spectral width are called superluminescent light-emitting diodes. There is a need for these devices in fiber optic systems having a requirement for low modal noise, such as in fiber optic gyroscopes. Commercially available superluminescent light-emitting diodes emit light at powers as high as 4-6 mW (milliwatts). However, when the power in these devices is increased above about 1-2 mW, the frequency spectrum is substantially narrowed. Driving the devices to higher powers may eventually cause lasing, in spite of the presence of the anti-reflective coating, since even the best anti-reflective coating will reflect some proportion of the light impinging on it, and lasing will eventually occur if the power is increased to a high enough level. For this reason, the anti-reflective coatings in superluminescent light-emitting diodes have to be carefully controlled to permit operation at higher power levels.

As the power of a superluminescent light-emitting diode is increased and its spectral width is consequently decreased, the coherence length of light from the device is increased. The coherence length is another measure of the spectral purity of light. As the spectral width becomes narrower, the coherence length increases. Some applications of superluminescent light-emitting diodes, such as fiber optic gyroscopes, require low modal noise, which means that the light source must have a low coherence length and correspondingly wide spectral width. Prior to this invention, available superluminescent light-emitting diodes were unable to meet this requirement.

It will be appreciated from the foregoing that there is still a need for a superluminescent light-emitting diode that can be operated at higher powers without spectral narrowing. The present invention satisfies this need.

SUMMARY OF THE INVENTION

The present invention resides in a superluminescent light-emitting diode, and a method for its manufacture, capable of operation at high powers without spectral narrowing. Briefly, and in general terms, the superluminescent light-emitting diode of the invention comprises a semiconductor structure including an active semiconductor layer at a junction between two semiconductor materials of opposite conductivity types, an anti-reflective coating on at least one facet of the structure, to inhibit lasing within the active layer and to permit light emission from one edge of the structure, means for applying an electrical forward-bias voltage across the junction to produce emission of light, and means within the semiconductor structure for producing a non-uniform gain profile along the active layer. The non-uniformity of the gain profile results in a broadening of the frequency spectrum of light emitted from the device. As the power is increased, the spectral width increases even more, permitting the output of relatively high powers while maintaining a broad spectral width.

The means for producing a non-uniform gain profile may include variations in the thickness of the active layer. Alternatively, or in combination with a non-uniform active layer thickness, the means for producing a non-uniform gain profile may include an asymmetrical electrical contact on the device. This causes the current flow through the device to be asymmetrical, and thereby produces the desired non-uniform gain profile.

Another alternative for producing the non-uniform gain profile includes a non-uniform profile in the thickness of one of the semiconductor layers of opposite conductivity type. In a typical structure, these layers are configured to define one or more channel regions from which light emission takes place. In the case of a multi-channel structure, the channels may be configured non-uniformly to produce the desired non-uniformity in gain profile.

Another parameter that may be varied to produce the non-uniform gain profile is the temperature. The temperature profile will, in any event, be dependent on the current density, but some structures may permit the control of temperature directly, to produce the desired lack of uniformity in gain profile.

The method of the invention comprises the steps of forming on a semiconductor substrate a first layer of semiconductor material of a particular conductivity type, forming on the first layer an active layer of semiconductor material, forming on the active layer a second layer of semiconductor material of opposite conductivity type to that of the first layer, and forming an electrical contact over the second layer. At least one of the forming steps results in the production of a non-uniform gain profile along the active layer, to permit operation at high powers and wide spectral widths. In the presently preferred embodiment of the invention, the step of forming the active layer results in the formation of an active layer of non-uniform thickness, and it is this structure that produces the non-uniform gain profile. Other method steps that have the same effect are forming one of the first and second layers with non-uniform thickness, for example as two channels of different depths, or forming the electrical contact asymmetrically with respect to the structure of the semiconductor layers.

It will be appreciated from the foregoing that the present invention represents a significant advance in the field of superluminescent light-emitting diodes. In particular, the invention provides a superluminscent diode capable of operation at high power levels while still maintaining a wide spectral width. Other aspects and advantages of the invention will become apparent from the following more detailed description, taken in conjunction with the accompanying drawings.

DESCRIPTION OF THE PREFERRED EMBODIMENTS

Figure 1:
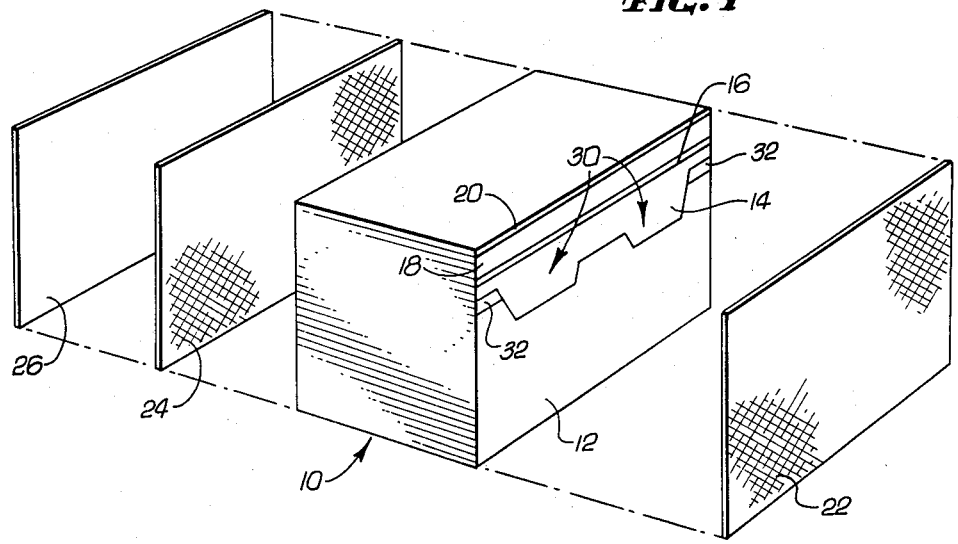
FIG. 1 is a simplified exploded isometric view of a typical planar superluminescent light-emitting diode.

As shown in the drawings for purposes of illustration, the present invention is concerned with an improved superluminescent light-emitting diode. Prior to the invention, output powers in excess of a few milliwatts could be achieved only at the expense of a narrower spectral width, and lasing may result at sufficiently high powers. The narrow spectral width resulting from operation at higher powers has rendered these diodes unsuitable for use in some applications. In fiber-optic gyros, for example, a light source with a relatively large spectral width is required.

In accordance with the invention, a superluminescent light-emitting diode is structured to have a non-uniform gain profile, and this gives rise to a characteristic spectral width that actually increases with increasing output power, unlike devices of the prior art, in which the spectral width decreases with increasing output power.

FIG. 1 shows the fundamental structure of a superluminescent light-emitting diode, of the planar, edge-emitting type. The device includes a semiconductor diode structure, indicated generally by reference numeral 10, comprising a substrate 12, a first cladding layer 14, an active layer 16, a second cladding layer 18 of opposite conductivity type to the first, and a contact layer 20. One facet of the structure 10 is covered with an anti-reflective coating 22 of a material such as either silicon nitride ($Si_3N_4$) or aluminum oxide ($Al_2O_3$). The opposite facet is covered by another coating 24 of either silicon nitride or aluminum oxide,, which is itself covered with a reflective metal layer 26.

The materials used in the structure are typically selected from Groups III and V of the periodic table of chemical elements. Two common combinations of materials used are: (a) gallium arsenide and aluminum gallium arsenide, and (b) indium phosphide and indium gallium arsenide phosphide. For the gallium arsenide and aluminum gallium arsenide combination, the substrate 12 is of p type gallium arsenide (GaAs), the first and second cladding layers 14 and 18 are p type and n type, respectively, aluminum gallium arsenide ($Al_{0.35}Ga_{0.65}As$), and the active layer 16 is of undoped aluminum gallium arsenide ($Al_{0.06}Ga_{0.94}As$). The upper contact layer 20 is of n type gallium arsenide (GaAs).

When a forward bias voltage is applied between the contact layer 20 and the substrate 12, and effectively across the pn junction formed by the two cladding layers 14 and 18, photons of light are emitted in the active layer 16. The anti-reflective coating 22 prevents a lasing action from taking place by repeated reflection between two opposed reflecting surfaces. Light is emitted from the edge of the active layer 16, and through the anti-reflective coating 22. In one form of such a device, the substrate 12 has one or more channels or grooves, two being shown at 30, perpendicular to the facet on which the anti-reflective coating 22 is applied. This twin-channel structure is one that is disclosed in the cross-referenced applications relating to diode lasers. This structure also includes a blocking layer 32 outside the regions occupied by the channels 30 and between the substrate 12 and the first cladding layer 14. The blocking layer 32 of the illustrative embodiment is of n type gallium arsenide, and confines the current flow substantially to the regions of the channels 30.

Devices of the same general type as shown in FIG. 1 emit power in the range 4-6 mW (milliwatts). However, for powers above 1-2 mW, the width of the frequency spectrum emitted from the device becomes very much narrowed, until it ultimately resembles that of a laser diode. Eventually, the device may begin lasing, in spite of the presence of the anti-reflective coating 22. This is because even the best anti-reflective coatings are partially reflective, and lasing can, therefore, still take place at relatively high power levels. Accordingly, prior to this invention it was important to control the quality of the anti-reflective coating 22 very carefully. Even then, the spectral width of the device would be unacceptably narrow at powers above a few milliwatts.

The invention was developed principally as a result of the recognition that variations in optical gain in the active layer 16 can be usefully employed to produce corresponding variations in the emitted wavelengths. In other words, a non-uniform gain profile leads to spectral broadening of the output light.

The gain, which is a measure of the incremental energy flux per unit length of the device, is a relatively complex function of a number of variables. It may be expressed as:

$$g = B\Gamma J_N - \alpha\Gamma, \tag{1}$$

where
  $J_N$ = normalized current density = $\eta J/d_A$,
  $J$ = current density,
  $d_A$ = active layer thickness,
  $B$ = gain coefficient,
  $\alpha$ = loss constant,
  $\Gamma$ = transverse confinement factor.
  $\eta$ = internal quantum efficiency These and the relationships discussed below were developed from the results given in the following publications:

1. F. Stern, "Gain current for GaAs laser with N type and undoped active layers," IEEE J. Quant. Elect., V. QE-9, p. 290, Feb. 1973.
2. F. Stern, "Calculated spectral dependence of gain in excited GaAs," J. Appl. Phys., V. 47, p. 5382, 1976.
3. H. C. Casey, Jr. and M. B. Parish "Heterostructure Lasers," N.Y. Academic Press, 1978.
4. S. Wang, C. Y. Chen, A. Liao and L. Figueroa, "Control of mode behavior in semiconductor lasers," IEEE J. Quant. Elect., V. 17, p. 453 (1981).

If a gain of approximately 100 inverse centimeters is assumed, it can be concluded from the results of these publications that the incremental variation of wavelength with respect to gain ($\Delta\lambda/\Delta g$) is approximately 0.4 Å cm (angstroms per inverse centimeter). In other words, a change in gain of about two inverse centimeters yields a wavelength change of about one angstrom. Some further numerical examples using these relationships will be discussed after the structure of the invention is further explained.

Figure 2:
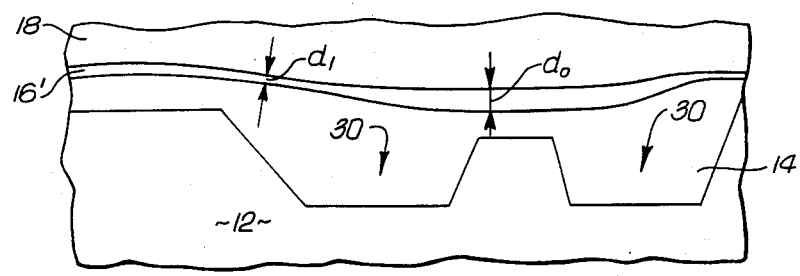
FIG. 2 is a simplified cross-sectional view of a superluminescent light-emitting diode having an active layer of non-uniform thickness.

With the foregoing requirement in mind, i.e. that there should be a variation in gain across the profile of the active layer 16, several possibilities are presented for achieving the non-uniform gain profile. It will be observed from equation (1) that the gain is affected by varying the thickness of the active layer 16, or by varying the current density through the active region. FIG. 2 shows an embodiment of the invention in which the thickness of the active layer is varied, and FIGS. 3 and 4 show alternative approaches for varying the current density.

In FIG. 2, a two-channel device is shown, with the active layer, referred to by 16, varying in thickness from a minimum value $d_1$ at the outside edges of the channels, to a maximum value $d_0$ between the channels. As a practical matter, it is difficult to fabricate an active layer of varying thickness without making the layer curved, i.e. of varying depth. In the regions of minimum layer thickness, the normalized current density $J_N$ will be maximized, as will be the gain.

Figure 3:
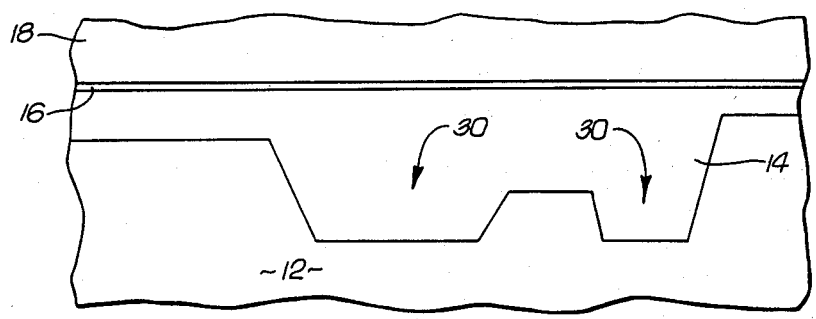
FIG. 3 is a simplified cross-sectional view of a superluminescent light-emitting diode having two channels of different widths.

In the embodiment shown in FIG. 3, variations in current density are induced by the differences in channel width. In FIG. 4, a metal contact strip 40 is shown over the upper layer 20. The effective area of the contact strip 40 is defined by a surrounding dielectric layer 42 interposed between the contact layer 40 and the upper layer 20 except in the desired effective contact area. Normally, this effective contact strip area is centered symmetrically with respect to the channels of the device. In this embodiment, the effective contact area is deliberately offset with respect to the axis of symmetry of the channels. This induces a lack of uniformity in the current profile through the device, and has the desired effect of producing a non-uniform gain profile.

Figure 4:
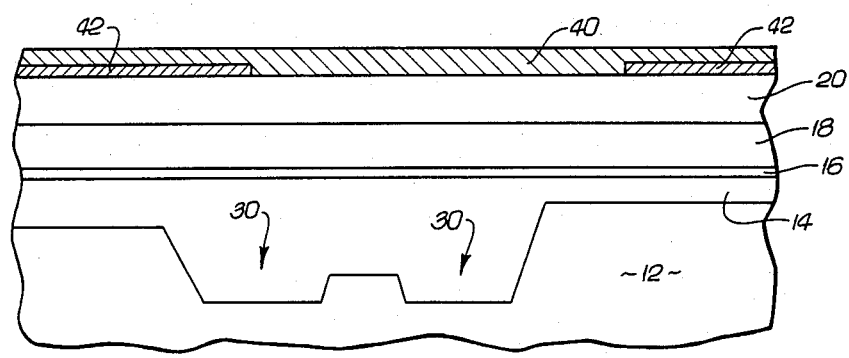
FIG. 4 is a simplified cross-sectional view of a superluminescent light-emitting diode having an electrical contact misaligned with the light-emitting regions.

It will be understood that the structural variations shown in FIGS. 2-4 may be used alone, or combined to produce the desired effect. A non-uniform current profile will also result in a non-uniform temperature profile across the active layer. In other structures it may be advantageous to generate a non-uniform temperature profile by some other means, and thereby produce the desired non-uniform gain profile.

Figure 5:
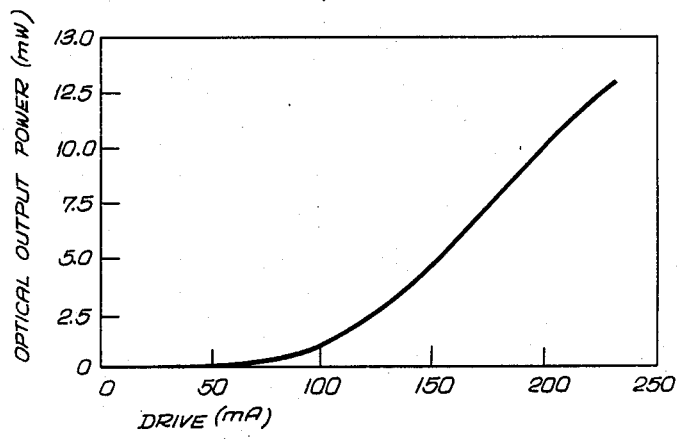
FIG. 5 is a graph showing the relationship between optical output power and drive current in a superluminescent light-emitting diode constructed in accordance with the invention.

FIG. 5 shows the variation of optical output power as a function of drive current. As will be observed from the graph, once a threshold current of about 50 mA (milliamperes) is exceeded, the output power increases in a practically linear manner with increasing drive current. Optical output powers of 10-12 mW are routinely achievable in the structure described.

Figure 6:
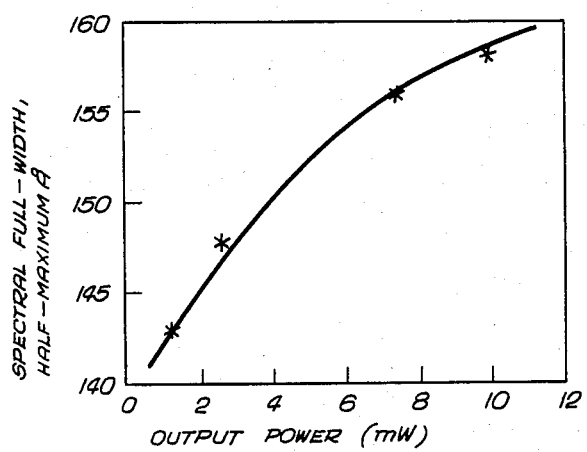
FIG. 6 is a graph showing the relationship between the spectral width and the output power in a superluminescent light-emitting diode constructed in accordance with the invention.

FIG. 6 shows the variation of spectral width as a function of optical output power. The spectral width is measured as the full width of the frequency spectrum at half the maximum height of the spectrum of the device. The unusual property shown graphically in FIG. 6 is that the spectral width increases almost linearly with increasing output power. Therefore, even at relatively high powers of 10-12 mW, the spectral width at half-maximum height is close to 160 angstroms.

The figures in the following table have been calculated from equation (1), assuming a quantum efficiency ($\eta$) of 0.9 and a gain coefficient (B) of 0.044 cm/A:

| J (KA/cm$^2$) | d ($\mu$m) | J (KAcm$^{-2}$ $\mu$m$^{-1}$) | $\Gamma$ | g (cm$^{-1}$) |
|---|---|---|---|---|
| 5 | 0.1 | 8.865 | .197 | 37 |
| 5 | 0.07 | 6.88 | .107 | 10.99 |
| 5 | 0.05 | 5.13 | .057 | 1.46 |
| 10 | 0.1 | 17.73 | .197 | 153 |
| 10 | 0.07 | 13.76 | .107 | 43.4 |
| 10 | 0.05 | 10.26 | .057 | 14.33 |
| 15 | 0.1 | 26.59 | .197 | 191 |
| 15 | 0.07 | 20.64 | .107 | 75.77 |
| 15 | 0.05 | 15.39 | .057 | 27.2 |

For the three current densities shown in the above table, and the variation in gain obtained for each, one can calculate the corresponding spectral widths, using the previously mentioned relationship 0.4 angstroms per unit change in gain. The resulting figures are:

| Spectral width (angstroms) | Current density (KA/cm$^2$) |
|---|---|
| 14 | 5 |
| 55 | 10 |
| 65.6 | 15 |

These numbers represent the minimal spectral broadening that will be obtained. The non-uniform current density and non-uniform temperature distribution will further enhance the spectral broadening.

It will be appreciated from the foregoing that the present invention represents a significant advance in the field of superluminescent light-emitting diodes. In particular, the invention provides a device capable of operation at relatively high power levels without loss of spectral width. In fact, the spectral width actually increases with the optical output power. It will also be appreciated that, although specific embodiments of the invention have been described in detail for purposes of illustration, various modifications may be made without departing from the spirit and scope of the invention. Accordingly, the invention is not to be limited except as by the appended claims.

We claim:
1. A superluminescent light-emitting diode comprising:
a semiconductor structure including an active semiconductor layer at a junction between two semiconductor materials of opposite conductivity types;
an anti-reflective coating on at least one facet of the structure, to inhibit lasing within the active layer;

electrical contact means for applying a forward-bias voltage across the junction to produce emission of light; and means within the structure for producing a non-uniform gain profile along the active layer, whereby the non-uniformity of gain profile results in a broadening of the frequency spectrum of light emitted from the device, as the power is increased.

2. A superluminescent light-emitting diode as set forth in claim 1, in which:

the means for producing a non-uniform gain profile includes variations in the thickness of the active layer.

3. A superluminescent light-emitting diode as set forth in claim 1, in which:

the means for producing a non-uniform gain profile includes asymmetry in the electrical contact means.

4. A superluminescent light-emitting diode as set forth in claim 1, in which:

the means for producing a non-uniform gain profile includes a non-uniform profile in the thickness of one of the semiconductor layers of opposite conductivity type.

5. A superluminescent light-emitting diode having a broad output spectrum at high powers, the diode comprising:

a substrate of semiconductor material of a first conductivity type;

a first cladding layer of semiconductor material formed over the substrate and having the same conductivity type;

an active layer of semiconductor material formed over the first cladding layer;

a second cladding layer formed over the active layer, of semiconductor material of the opposite conductivity type to that of the first cladding layer;

an upper layer formed over the second cladding layer;

a conductive contact stripe formed over the upper layer, for applying a forward bias across the junction between the cladding layers; and an anti-reflective coating on at least one facet of the structure, to inhibit lasing within the active layer;

in which the foregoing structure is configured to provide a non-uniform gain profile along the active layer, which condition results in a relatively wide spectral width, even at relatively high output powers.

6. A superluminescent light-emitting diode as set forth in claim 5, in which:

the substrate is of p type gallium arsenide;

the first and second cladding layers are of p type and n type aluminum gallium arsenide, respectively; and the active layer is of undoped aluminum gallium arsenide.

7. A superluminescent light-emitting diode as set forth in claim 6, in which:

the upper layer is of n type gallium arsenide.

8. A superluminescent light-emitting diode as set forth in claim 6, in which:

the cladding layers are of $Al_{0.35}Ga_{0.65}As$ and the active layer is of $Al_{0.06}Ga_{0.94}As$.

9. A superluminescent light-emitting diode as set forth in claim 5, in which:

the substrate is of n type gallium arsenide;

the first and second cladding layers are of n type and p type aluminum gallium arsenide, respectively; and the active layer is of undoped aluminum gallium arsenide.

10. A method for fabricating a superluminescent diode, compridsing the steps of:

forming on a semiconductor substrate a first layer of semiconductor material of a particular conductivity type;

forming on the first layer an active layer of semiconductor material;

forming on the active layer a second layer of semiconductor material of conductivity type opposite to that of the first layer;

forming an electrical contact over the second layer; and forming an anti-reflective coating on at least one facet of the structure, to inhibit lasing within the active layer;

and in which at least one of the foregoing steps results in the production of a non-uniform gain profile along the active layer, to permit operation at high powers and wide spectral widths.

11. A method as set forth in claim 10, in which:

the step of forming the active layer results in the formation of an active layer of non-uniform thickness, and it is this structure that produces the non-uniform gain profile.

12. A method as set forth in claim 10, in which:

the step of forming one of the first and second layers includes forming it with non-uniform thickness, over two channels of different depths.

13. A method as set forth in claim 10, in which:

a non-uniform gain profile is achieved by forming the electrical contact assymmetrically with respect to the structure of the semiconductor layers.

14. A superluminescent light-emitting diode having a broad output spectrum at high powers, the diode comprising:

a substrate of semiconductor material of a first conductivity type;

a first cladding layer of semiconductor material formed over the substrate and having the same conductivity type;

an active layer of semiconductor material formed over the first cladding layer;

a second cladding layer formed over the active layer, of semiconductor material of the opposite conductivity type to that of the first cladding layer;

an upper layer formed over the second cladding layer; and a conductive contact stripe formed over the upper layer, for applying a forward bias across the junction between the cladding layers;

in which the foregoing structure is configured to provide a non-uniform gain profile along the active layer, which condition results in a relatively wide spectral width, even at relatively high output powers;

and in which the active layer has a non-uniform thickness, to produce the non-uniform gain profile.

15. A superluminescent light-emitting diode having a broad output spectrum at high powers, the diode comprising:

a substrate of semiconductor material of a first conductivity type;

a first cladding layer of semiconductor material formed over the substrate and having the same conductivity type;

an active layer of semiconductor material formed over the first cladding layer;

a second cladding layer formed over the active layer, of semiconductor material of the opposite conductivity type to that of the first cladding layer;

an upper layer formed over the second cladding layer; and a conductive contact stripe formed over the upper layer, for applying a forward bias across the junction between the cladding layers;

in which the foregoing structure is configured to provide a non-uniform gain profile along the active layer, which condition results in a relatively wide spectral width, even at relatively high output powers;

and in which the first cladding layer is formed over two parallel channels in the substrate, and the two channels are of different widths, to produce a non-uniform current distribution through the device.

16. A superluminescent light-emitting diode having a broad output spectrum at high powers, the diode comprising:

a substrate of semiconductor material of a first conductivity type;

a first cladding layer of semiconductor material formed over the substrate and having the same conductivity type;

an active layer of semiconductor material formed over the first cladding layer;

a second cladding layer formed over the active layer, of semiconductor material of the opposite conductivity type to that of the first cladding layer;

an upper layer formed over the second cladding layer; and a conductive contact stripe formed over the upper layer, for applying a forward bias across the junction between the cladding layers;

in which the foregoing structure is configured to provide a non-uniform gain profile along the active layer, which condition results in a relatively wide spectral width, even at relatively high output powers;

and in which the first cladding layer is formed over two parallel channels in the substrate, and the conductive stripe is asymmetrical with respect to the two channels in the substrate.

* * * * *